(12) United States Patent
Egami et al.

(10) Patent No.: US 6,716,773 B2
(45) Date of Patent: Apr. 6, 2004

(54) PROCESS FOR PRODUCING SEMICONDUCTOR SUBSTRATES

(75) Inventors: Miki Egami, Fukuoka (JP); Ryo Muraguchi, Fukuoka (JP)

(73) Assignee: Catalysts & Chemicals Industries Co., Ltd. (JP)

(*) Notice: Subject to any disclaimer, the term of this patent is extended or adjusted under 35 U.S.C. 154(b) by 0 days.

(21) Appl. No.: 10/246,833

(22) Filed: Sep. 19, 2002

(65) Prior Publication Data

US 2003/0062599 A1 Apr. 3, 2003

(30) Foreign Application Priority Data

Sep. 21, 2001 (JP) .................................... P. 2001-289258

(51) Int. Cl.[7] ............................................. H01L 21/302
(52) U.S. Cl. ........................ 438/798; 438/782; 438/790; 438/794
(58) Field of Search ................................ 438/782, 790, 438/794, 798; 257/E23.118

(56) References Cited

U.S. PATENT DOCUMENTS

| 4,510,176 A | * | 4/1985 | Cuthbert et al. ............ 438/780 |
| 5,939,139 A | * | 8/1999 | Fujimoto .................... 427/240 |
| 6,096,233 A | * | 8/2000 | Taniyama et al. ............ 216/92 |
| 6,261,357 B1 | | 7/2001 | Egami et al. |

FOREIGN PATENT DOCUMENTS

| JP | 2-237070 A | 9/1990 |
| JP | 8-316186 A | 11/1996 |
| JP | 9-315812 A | 1/1999 |
| JP | 11-004050 A | 1/1999 |
| JP | 11-004051 A | 1/1999 |

* cited by examiner

Primary Examiner—George Fourson
Assistant Examiner—Julio J. Maldonado
(74) Attorney, Agent, or Firm—Webb Ziesenheim Logsdon Orkin & Hanson, P.C.

(57) ABSTRACT

A process for producing semiconductor substrates with a coating film having excellent chemical resistance with high yield and excellent production reliability without any development of cracks and any generation or collection of foreign matter resulting from a projected portion of the coating film, which includes the steps of: (a) forming a coating film by coating an insulating film-forming coating liquid on a substrate mounted on a rotating disc of a spin coater according to a spin coating method; and (b) removing the projected portion of the coating film formed at a periphery of the substrate by ejecting a solvent through a nozzle moving from any point on a line drawn between the periphery edge and a center of the substrate toward the periphery edge while rotating the substrate.

10 Claims, 6 Drawing Sheets

PROCESS FOR PRODUCING SEMICONDUCTOR SUBSTRATES

FIELD OF THE INVENTION

This invention relates to a semiconductor substrate and a process for producing the semiconductor substrate. More particularly, it relates to a semiconductor substrate having an insulating film of uniform film thickness on a substrate and having an excellent production reliability and to a process for producing the semiconductor substrate.

BACKGROUND OF THE INVENTION

Various integrated circuits have been used in computers and various electronic devices and, with reduction in size and enhanced performance thereof, higher integration and higher performance of the circuits have been required as well as production reliability.

Figure 8:
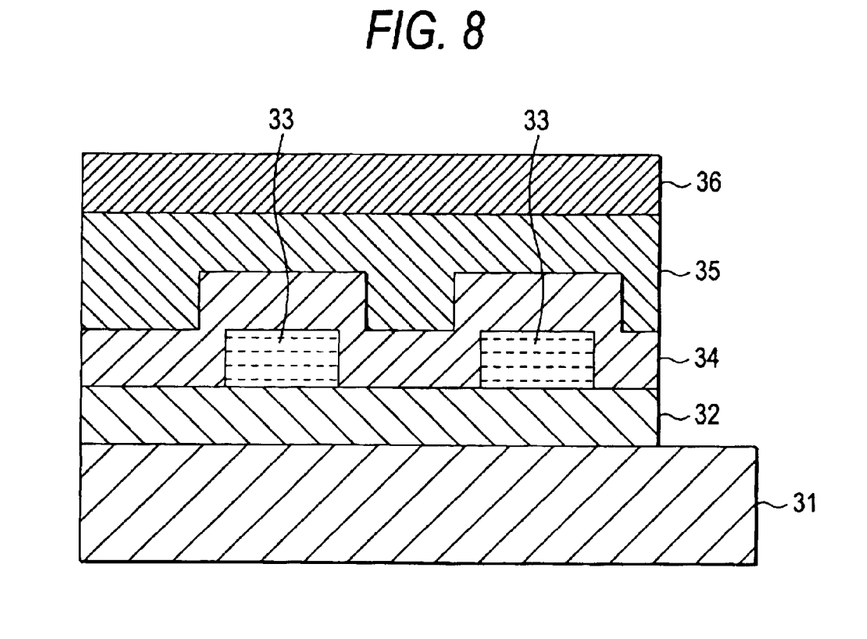
FIG. 8 is schematic cross section showing the substrate having formed thereon a multi-layer wiring circuit.

With respect to these integrated circuits, multi-layer wiring circuits as shown in FIG. 8 have conventionally been used for raising the degree of integration of semiconductor integrated circuits.

Referring to the steps for producing semiconductor substrates of the integrated circuits, an oxide film is formed as a first insulating film 32 on a substrate 31 such as silicon, then a first wiring layer 33 composed of an aluminum film or the like is formed on the first insulating film surface. Subsequently, an inter layer dielectric film 34 such as a silica film or a silicon nitride film is deposited thereon by CVD method or plasma CVD method; a silica insulating film (planalizing film) 35 for planalizing the inter layer dielectric film 34 is formed on the inter layer dielectric film; a second insulating film 36 is deposited, if necessary, on the silica insulating film 35; a second wiring layer (not shown) is formed; and, if necessary, an inter layer dielectric film, a planalizing film, and an insulating film are further formed on the second wiring layer, the resulting product being used as a highly integrated circuits having the multi-layer wiring structure.

Figure 9:
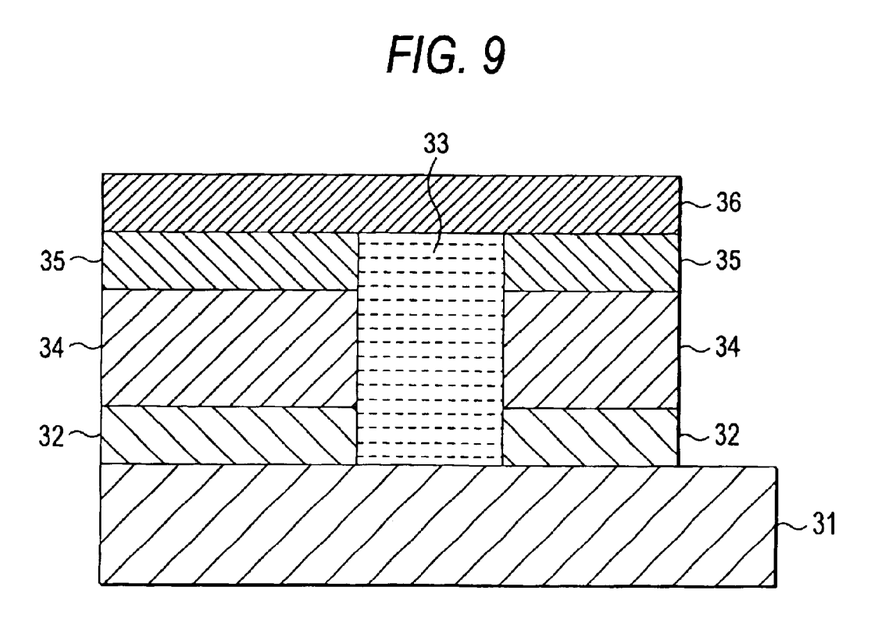
FIG. 9 is a schematic cross section showing the semiconductor substrate.

Also, a semiconductor substrate as illustrated in FIG. 9 is known.

On a substrate 31 are formed an oxide film as a first insulating film 32, an inter layer dielectric film 34 (if necessary), and an insulating film 35 in this order, and a circuit 33 is formed in this layered film (insulating film) and, further, a second insulating film 36 is formed on the insulating film 35 and the circuit. This constitution is referred to as a first wiring layer.

Further, a second wiring layer (not shown) having the same structure as that of the first wiring layer is formed on the second insulating film 36. The first wiring layer and the second wiring layer are connected to each other through a through-hole which is a connecting groove (not shown). In the same manner, a third wiring layer or more of the wiring layers may be formed thereon.

The inter layer dielectric film having the multi-layer wiring structure is provided for the purpose of planalizing an uneven surface of a substrate or a wiring layer as well as for ensuring insulation between an upper layer and a lower layer (between a substrate and a wiring layer thereon, or between an upper wiring layer and a lower wiring layer).

As a method for forming such inter layer dielectric film, there are illustrated: (1) a method of forming a $SiO_2$ film on the surface of a substrate by a chemical vapor deposition (CVD) of a compound gas such as $SiH_4$; (2) a method of forming a $SiO_2$ film on the surface of a substrate by plasma deposition of tetraethoxysilane (TEOS); and (3) a method of forming a $SiO_2$ film by coating a siloxane-based coating liquid or a silazane-based coating liquid to the surface of a substrate by a spin coating.

Figure 1:
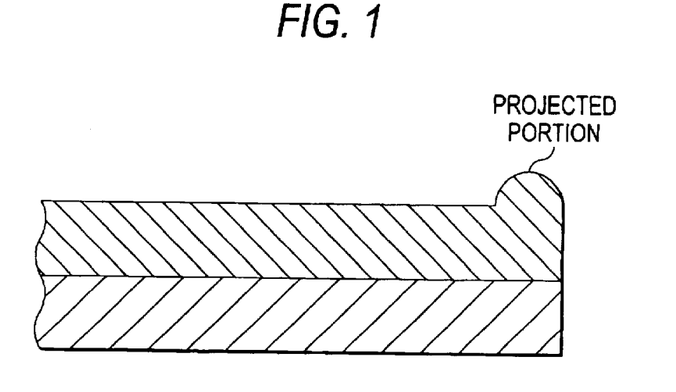
FIG. 1 is a schematic cross section showing a projected portion of a coating film formed at the periphery of a substrate.

Of these methods, the above method (3) using a spin coater is preferred for forming the inter layer dielectric film because of its large throughput capacity and for forming a smooth film whose surface was planalized. However, there have been cases where a projected portion is formed as a protuberance of the coating film as shown in FIG. 1 after spin coating the coating liquid because the coating liquid is centrifuged to the periphery of a silicon wafer as a substrate. FIG. 1 shows a schematic cross section of the projected portion formed at the edge of the periphery.

Such periphery of the silicon wafer might contact with other constituent member and be stained therewith and, during conveying the wafer, the projected portion of the insulating film at the periphery edge thereof might contact with other devices thereby to develop some cracks. Development of such cracks means generation of a large number of unwanted foreign matter, which might lead to a serious reduction in production yield.

Therefore, for example, Japanese Patent Laid-Open No. 316186/1996 proposes to wash away the projected portion by ejecting a solvent, usually downward to the projected portion after spin-coating, for the purpose of removing the projected portion at the periphery of the silicon wafer.

Figure 10A:
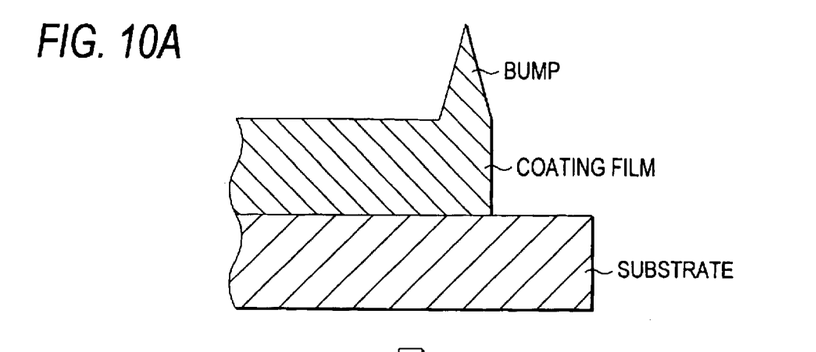
FIGS. 10A, 10B and 10C each is a schematic view showing the state of an insulating film formed on the insulating film on which a bump has been formed as in the prior art.
Figure 10B:
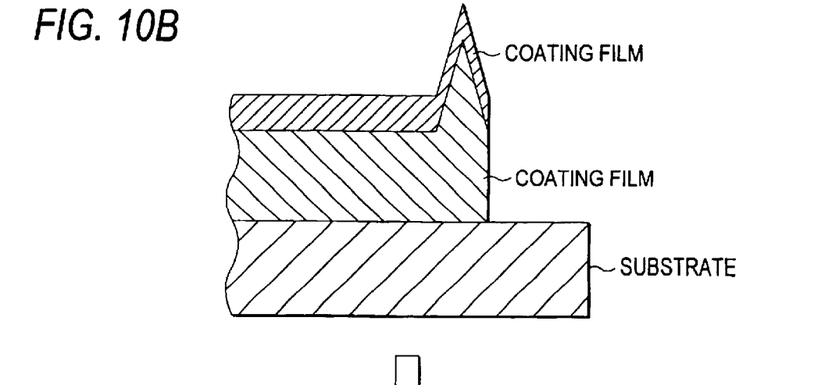
Figure 10C:
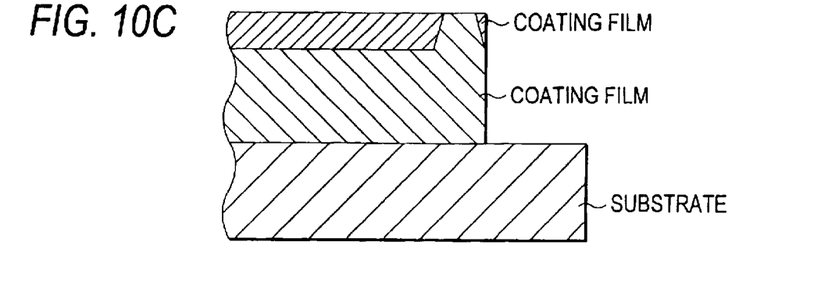

In this case, however, a bump is formed in some cases as shown in FIG. 10A, though depending upon the kind of the coating liquid (e.g., types of the insulating component and the solvent, and its contents) or a solvent to be used for washing. Such bump may invite the collection of foreign matter as in the case of a projected portion. Further, in a situation where a coating film is formed on the first insulating film such as in forming the inter layer dielectric film, a condition results as shown in FIG. 10B which involves the problem that, when the surface is mechanically polished as needed, the underlying first insulating layer (coating film) becomes bare as shown in FIG. 10C, thus the resulting semiconductor substrate becomes inferior in chemical resistance.

SUMMARY OF THE INVENTION

The present invention intends to solve the above-described problems with the prior art and to provide a process for producing, with a high yield and an excellent production reliability, a semiconductor substrate having no projected portion or protuberance and no bump, and therefore suffering no cracking and generating no foreign matter and having an excellent chemical resistance.

The process of the present invention for producing semiconductor substrates is characterized by comprising the steps of:
(a) forming a coating film by coating an insulating film-forming coating liquid on a substrate mounted on a rotating disc of a spin coater according to a spin coating method; and then
(b) removing a projected portion of the coating film formed at the periphery of the substrate by ejecting a solvent through a nozzle moving from any point on a line drawn between the periphery edge and the center of the substrate toward the periphery edge while rotating the substrate.

The coating liquid for forming the insulating film (SOG film) preferably comprises one or more of silicon-containing compound selected from the group consisting of an alkoxysilane represented by the following general formula (I) or its hydrolyzate and a halogenated silane represented by the following general formula (II) or its hydrolyzate, and an organic solvent:

$$X_nSi(OR)_{4-n} \quad (I)$$

$$X_nSiX'_{4-n} \quad (II)$$

wherein X represents a hydrogen atom, a fluorine atom, an alkyl group having 1 to 8 carbon atoms, a fluorine-substituted alkyl group, an aryl group or a vinyl group, R represents a hydrogen atom, an alkyl group having 1 to 8 carbon atoms, an aryl group or a vinyl group, X' represents a halogen atom, and n represents an integer of 0 to 3, provided that when silicon compounds represented by the above general formulae (I) and (II) are used together, at least one of X in the above general formulae (I) and (II) represents H (hydrogen atom).

The coating liquid for forming the insulating film (SOG film) preferably comprises one or more of silicon-containing compound selected from the group consisting of a polysilazane having a repeating unit represented by the following general formula (III), and an organic solvent:

(III)

wherein $R^1$, $R^2$ and $R^3$ each independently represent a hydrogen atom or an alkyl group having 1 to 8 carbon atoms.

The coating liquid for forming the insulating film (SOG film) preferably comprises one or more of silicon-containing compound selected from the group consisting of an alkoxysilane represented by the following general formula (I) or its hydrolyzate and a halogenated silane represented by the following general formula (II) or its hydrolyzate, one or more of silicon-containing compound selected from the group consisting of a polysilazane having a repeating unit represented by the following general formula (III), and an organic solvent:

$$X_nSi(OR)_{4-n} \quad (I)$$

$$X_nSiX'_{4-n} \quad (II)$$

wherein X represents a hydrogen atom, a fluorine atom, an alkyl group having 1 to 8 carbon atoms, a fluorine-substituted alkyl group, an aryl group or a vinyl group, R represents a hydrogen atom, an alkyl group having 1 to 8 carbon atoms, an aryl group or a vinyl group, X' represents a halogen atom, and n represents an integer of 0 to 3, provided that when silicon compounds represented by the above general formulae (I) and (II) are used together, at least one of X in the above general formulae (I) and (II) represents H (hydrogen atom);

(III)

wherein $R^1$, $R^2$ and $R^3$ each independently represent a hydrogen atom or an alkyl group having 1 to 8 carbon atoms.

It is preferred that the coating liquid for forming the insulating film (SOG film) further contains an easily decomposable resin.

The semiconductor substrate of the present invention is a semiconductor substrate obtained by the above-described process, wherein the insulating film on the substrate has an average film thickness (T) of from 0.1 to 6 μm, and the relation between thickness of the insulating film at the periphery ($T_E$) and the average film thickness (T) is represented by the following formula:

$$0.8T < T_E < 1.2T.$$

DETAILED DESCRIPTION OF THE INVENTION

The typical process of the present invention for producing a semiconductor substrate is illustratively described below.

The semiconductor substrate obtained by the process of the present invention comprises a substrate and one or more insulating films formed on the substrate.

Figure 4:
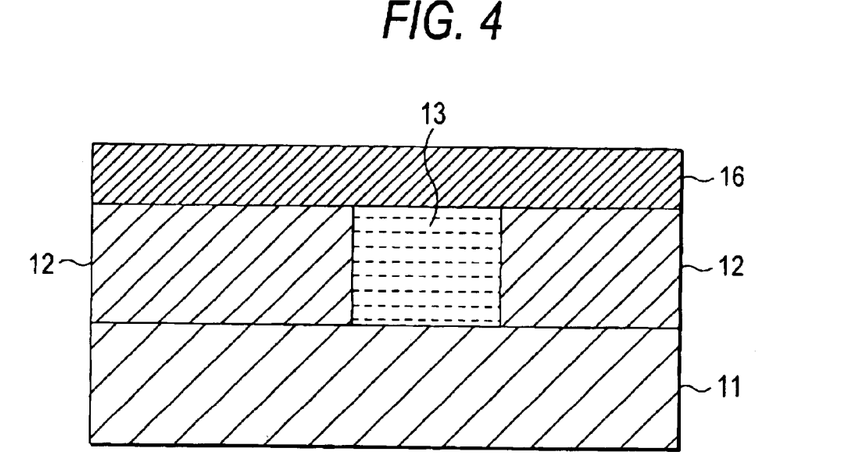
FIG. 4 is a schematic cross section showing the semiconductor substrate of the present invention.
Figure 5:
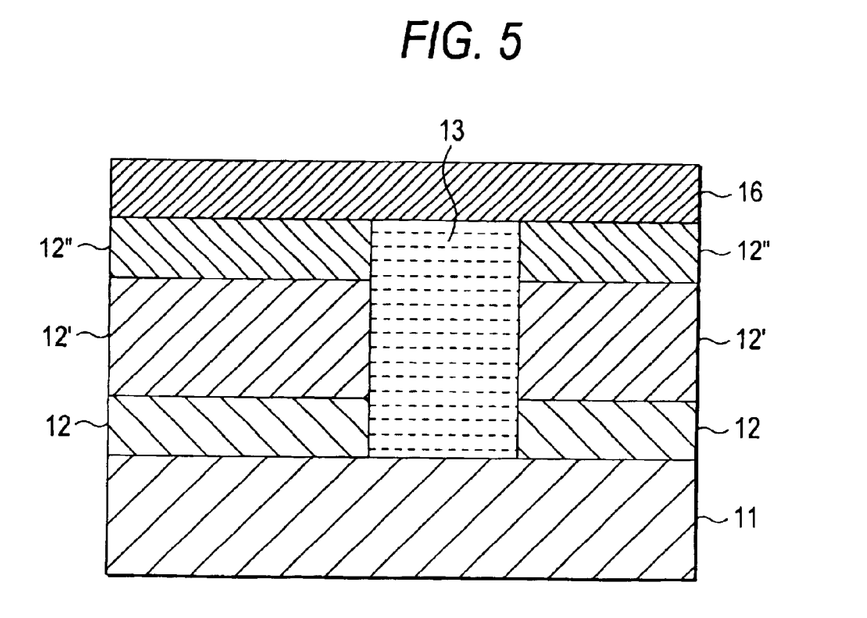
FIG. 5 is a schematic cross section showing the semiconductor substrate of the present invention.
Figure 6:
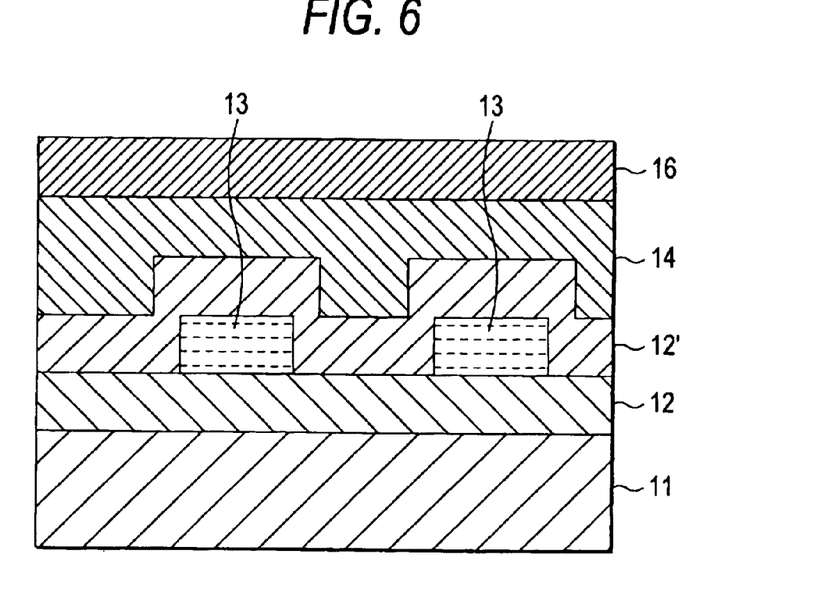
FIG. 6 is a schematic cross section showing the semiconductor substrate of the present invention.

Examples of the semiconductor substrate of the present invention are shown in FIGS. 4 to 6.

FIGS. 4 to 6 respectively show schematic cross sections of the semiconductor substrates. In FIG. 4, numeral 11 designates a substrate, 12 an insulating film, 13 a circuit, and 16 an insulating film. In the semiconductor substrate shown in FIG. 4, the insulating film 12 and the circuit 13 are provided on the substrate 11, and the insulating film 16 is provided on the insulating film 12 and the circuit 13. Additionally, on the insulating film 16 may repeatedly be provided the same constitution of the insulating film, circuit and insulating film in this order optionally connected through a through-hole which is a circuit-connecting groove (not shown).

Further, as is shown in FIG. 5, a plurality of films 12' and 12" may be formed on the insulating film 12. (The film 12" is referred to as "inter layer dielectric film".)

Still further, as is shown in FIG. 6, it is possible to provide an inter layer dielectric film 12' on the circuit 13 provided on the surface of the insulating film 12, and to provide a planalizing film 14 for planalizing the uneven surface having been formed by providing the circuit. It is also possible to further provide an insulating film 16 on the surface of the planalizing film 14.

With respect to the above semiconductor device, the process of the present invention for producing a semiconductor device comprises the steps of:

(a) forming a coating film by coating an insulating film-forming coating liquid on a substrate mounted on a rotating disc of a spin coater according to a spin coating method; and then (b) removing a projected portion of the coating film formed at the periphery of the substrate by ejecting a solvent through a nozzle moving from any point on a line drawn between the periphery edge and the center of the substrate toward the periphery edge while rotating the substrate.

(i) Step (a) (Formation of a Coating Film):

According to the present invention, glass or silicon is used as the substrate 1 and at least one or more insulating films are formed on this substrate.

These insulating films are not particularly limited as long as they comprise an insulating material. For example, there are those which are formed of silica, alumina, titania, silicon nitride, silicon carbide or organic resin polymer. Additionally, the insulating film may comprise one of them or may comprise two or more of them. Further, it may be of a multi-layer structure wherein other insulating films are formed on and under it.

In the present invention, the insulating film is formed on the substrate by the spin coating method using an insulating film-forming coating liquid. (The insulating film thus obtained by the spin coating method is sometimes referred to as "SOG film").

As the insulating film-forming coating liquid, any one that can form an insulating film may be used with no limitation. A coating liquid containing a precursor of insulating substance such as silica, alumina, titania or a resin polymer may be used.

Examples of the precursor include silicon compounds, aluminum compounds, titanium compounds, hydrolyzates thereof, organic resin monomers, oligomers, and emulsion resins.

The insulating film obtained by using such coating liquid shows excellent properties of filling up a gap (difference in level) on the substrate and forms an insulating film with a smooth surface.

In addition, an insulating film comprising silica as disclosed in Japanese Patent Laid-Open No. 237030/1990 filed by the applicant(s) shows a high contact resistance and a low dielectric constant and shows excellent planalizing properties, thus being preferred.

Also, an insulating film formed by using a coating liquid-for forming a silica-containing film as disclosed in Japanese Patent Laid-Open No. 315812/1997 (corresponding to U.S. Pat. No. 6,261,357) filed by the applicant(s) shows excellent adhesion to the coated surface, excellent mechanical strength, excellent chemical resistance and cracking resistance, and shows excellent planalizing properties, thus being preferred.

Figure 2:
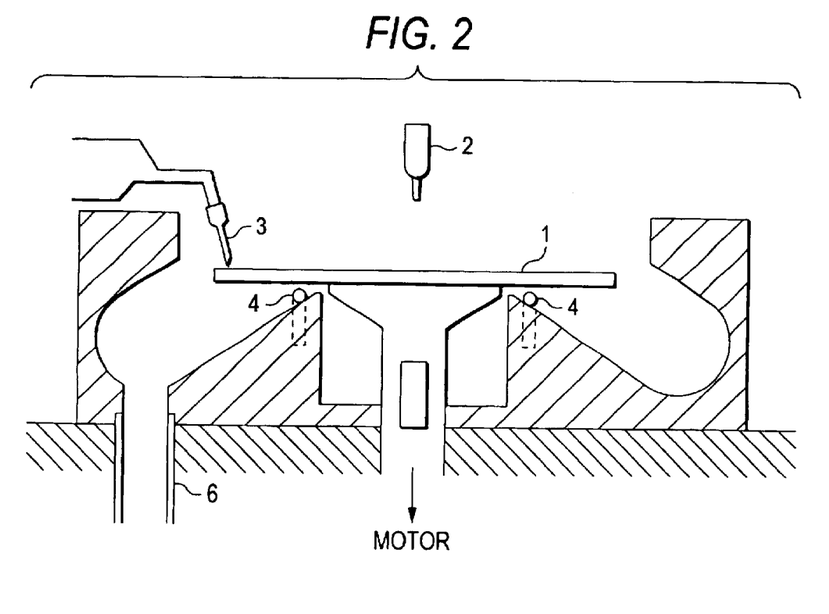
FIG. 2 is a schematic view showing the spin coater to be used in the present invention.

In the present invention, such coating liquid is coated by the spin coating method using a spin coater as shown in FIG. 2. Specifically, in FIG. 2, numeral 1 designates a substrate, 2 a nozzle for spraying a coating liquid, 3 a nozzle for ejecting a washing solvent, 4 a nozzle for ejecting a washing solvent to wash the backside of the substrate, and 6 piping for discharging the washing solvent used. The nozzle 3 for ejecting the washing solvent is constituted by a member having a shape of syringe or a shape similar to it and, upon washing the projected portion of the film formed on the substrate, is set over the periphery of the wafer shown in FIG. 2. The nozzle 4 is used for ejecting the washing solvent in a slanted upward direction to wash the backside of the substrate. In the spin coater shown in FIG. 2, the substrate 1 is mounted on a rotating disc which is interlocked with a motor, and the coating liquid is dropped or sprayed through the above-located coating liquid-spraying nozzle 2, the coating liquid spreads on the surface of the substrate 1 by centrifugal force to form a coating film.

In comparison with other CVD methods or the like, the spin coating method gives not only a larger throughput capacity but also an easier formation of a planarized insulating film and, further, imposes no restriction on a gasification of starting materials and others, and hence it permits the use of various insulating materials.

Conditions upon forming the coating film by using the spin coater vary depending upon the kind and size of the substrate, solid content of the insulating components contained in the coating liquid and kind of the solvent contained therein, but are preferably selected from 500 to 5000 rpm in rotation number, 20 to 30° C. in temperature, and 5 seconds to 5 minutes in time.

It is desired that the formed coating film has a resultant insulating film thickness in the range of from 0.1 to 6 $\mu$m.

At the periphery of the thus obtained coating film formed by the spin coating method a projected portion is formed. As has been described hereinbefore, this projected portion might generate cracks which would cause the collection of unwanted foreign matter, which must then be removed.

(ii) Step (b) (Removal of the Projected Portion)

Then, the thus formed projected portion at the periphery is removed.

Removal of the projected portion at the periphery is conducted by ejecting a washing solvent through the nozzle 3 as shown in FIG. 2.

Figure 3:
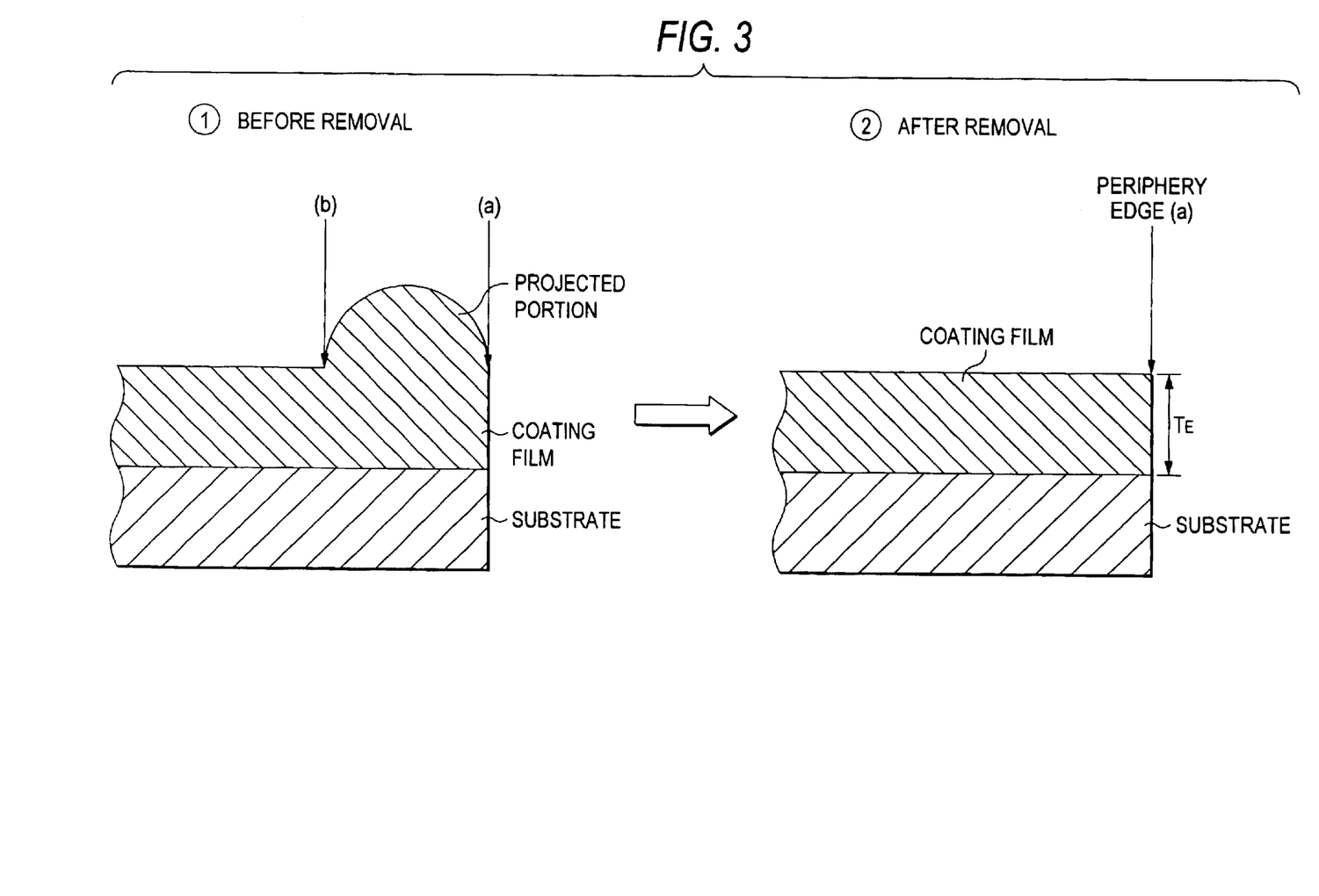
FIG. 3 is an enlarged schematic view showing the coating film formed at the periphery of the substrate.

In the present invention, the projected portion of the coating film at the periphery of the substrate is removed by ejecting a washing solvent through the nozzle 3 moving from any point on the line drawn between the periphery edge and the center of the substrate toward the periphery edge while rotating the substrate. Specifically, the nozzle 3 is moved from position (a) shown in FIG. 3 (edge of the periphery) to position (b) without ejecting the washing solvent and, when the nozzle reaches position (b), ejection of the washing solvent is initiated, followed by moving the nozzle from the position (b) to the position (a) to thereby remove the projected portion. Additionally, FIG. 3 is an enlarged schematic view showing the coating film formed at the periphery of the substrate after the projected portion has been removed.

This distance ((b)–(a)) from the periphery edge varies depending upon thickness of the formed coating film, rotation number, and viscosity and surface tension of the coating liquid, thus not being limited, and the position (b) is where the skirts of the projected portion in the direction toward the center becomes flat (or the vicinity of the boundary between the projected portion and the flat portion in the direction of from the center to the periphery). Conveniently, the distance may be in the range of from 1 to 5 mm.

In case where the distance from the periphery edge is shorter than 1 mm, the protuberance (projected portion) at the periphery might not be fully removed and, during conveying the semiconductor substrate, the film might contact with an arm of a device or a wafer case, leading to stain or breakage to generate foreign matters.

As the washing solvent to be used in the present invention, any one that can remove the projected portion without forming a bump can be used with no particular limitations. There are illustrated, for example, alcohols such as ethyl alcohol and isopropyl alcohol (IPA); ketones such as acetone, cyclohexanone and methyl isobutyl ketone (MIBK); glycol ethers such as propylene glycol monopropyl ether; and propylene glycol monomethyl ether acetate (PGMEA). Among them, organic solvents with a low toxicity such as PEGMEA described above are preferred.

After removal of the projected portion, thickness of the periphery edge of the insulating film (shown by arrow (a)), $T_E$, and the average film thickness of the insulating film, T, are in the following relation:

$$0.8T < T_E < 1.2T$$

Preferably, $T_E$ is from 0.9 times to 1.1 times T, with 0.95 to 1.05 being particularly preferred.

In case where the thickness of the periphery edge of the insulating film ($T_E$)(shown by arrow (a)) is less than 0.8 times the average film thickness (T), an undesired decrease in insulation or insufficient planalizing properties of other films (i.e., insulating films) to be formed on this insulating film may result.

In case where the thickness of the periphery edge of the insulating film ($T_E$) is more than 1.2 times the average film thickness (T), cracks may generate, with the collection of a large amount of foreign matter, or a reduced yield of semiconductor substrates may result.

Also, in the semiconductor substrate of the present invention, part of projected portions located within the periphery edge of the insulating film is removed.

Figure 7:
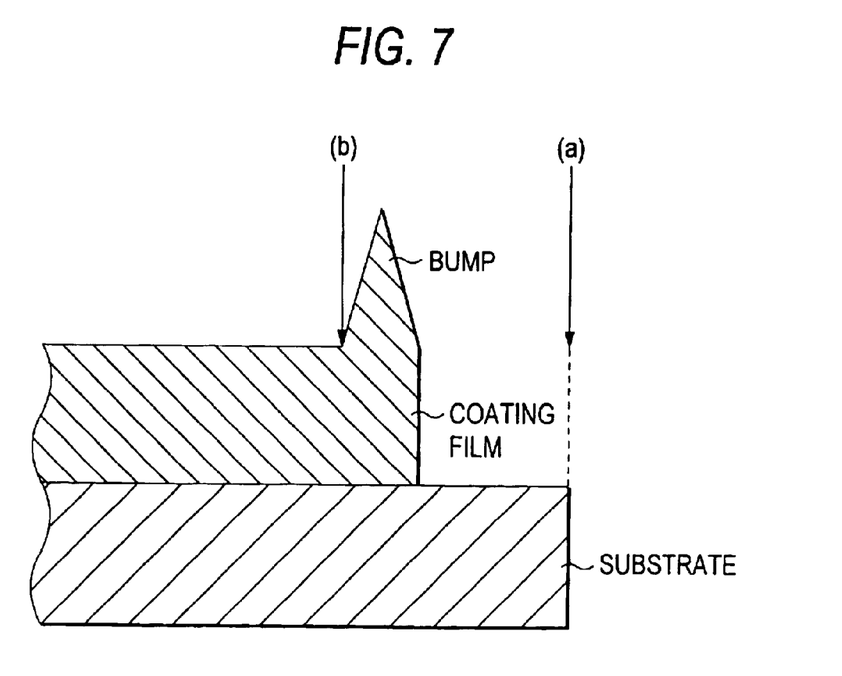
FIG. 7 is a schematic view showing a bump formed when the ejecting nozzle is dragged in the conventional manner.

Additionally, in FIG. 3, the projected portion can be removed by dragging the ejecting nozzle 3 from position (a) to position (b) while ejecting the washing solvent through the nozzle, or by first dragging the ejecting nozzle 3 from position (a) to position (b) while ejecting the washing solvent through the nozzle, then dragging (moving) the ejecting nozzle 3 from position (b) to position (a) while ejecting the washing solvent through the nozzle. However, a bump might be newly formed in the vicinity of position (b) at which the dragging is turned back as shown in FIG. 7. Additionally, FIG. 7 is a schematic view showing the formation of a bump when the ejecting nozzle is dragged in the conventional manner.

As is shown in FIG. 7, when the bump is formed, ($T_E$) exceeds in some cases 1.2T, thus causing generation of cracks or becoming the cause of foreign matters. Further, even when a planalizing film is formed on the insulating film on which such bump has been formed and the planalizing film is mechanically polished, part of the underlying insulating film becomes bare, as shown in the foregoing FIGS. 10B and 10C, thus chemical resistance being in some cases decreased.

Measurement of the average film thickness is conducted by means of an ellipsometer (ESVG (trade name), manufactured by SOPRA Inc.), and thickness of the periphery can be measured by using a contact type height difference-measuring meter (main body: F-MD-S75B (trade name) manufactured by TOKYO SEIMITSU CO., LTD., measuring unit: F-RM-S25B (trade name) manufactured by TOKYO SEIMITSU CO., LTD.).

After coating the insulating film-forming coating liquid by the spin coating method and then removing the projected portion of the coating film formed at the periphery of the substrate, the insulating film is dried as needed to cure the insulating film.

As for the preferred conditions, drying may be conducted at a temperature of about 80 to about 350° C., and curing may be conducted at a temperature of 300 to 450° C.

In addition, the insulating film may, if necessary, be constituted by two or more films, an inter layer dielectric film may be provided between two insulating films as shown in FIG. 5, and, further, a planalizing film or the like may be formed. In the case of forming these insulating films, the inter layer dielectric film and the planalizing film in the same manner by the spin coating method using film-forming coating liquids, a projected portion of the film formed at the periphery may be removed in the same manner as with the aforesaid insulating film.

Also, a circuit may be formed as needed. Such circuit may be formed in a conventionally known manner. For example, the circuit may be formed by common Al wiring or by forming a wiring groove by the resist method, forming a Cu layer thereon, and mechanically polishing the film.

Further, a semiconductor substrate of a multi-layer structure may be produced by forming a through-hole (connecting groove), and repeating the aforesaid steps.

The coating liquid for forming the insulating film (SOG film) preferably comprises one or more of silicon-containing compound selected from the group consisting of an alkoxysilane represented by the following general formula (I) or its hydrolyzate and a halogenated silane represented by the following general formula (II) or its hydrolyzate, and an organic solvent:

$$X_nSi(OR)_{4-n} \qquad (I)$$

$$X_nSiX'_{4-n} \qquad (II)$$

wherein X represents a hydrogen atom, a fluorine atom, an alkyl group having 1 to 8 carbon atoms, a fluorine-substituted alkyl group, an aryl group or a vinyl group, R represents a hydrogen atom, an alkyl group having 1 to 8 carbon atoms, an aryl group or a vinyl group, X' represents a halogen atom, and n represents an integer of 0 to 3, provided that when silicon compounds represented by the above general formulae (I) and (II) are used together, at least one of X in the above general formulae (I) and (II) represents H (hydrogen atom).

The coating liquid for forming the insulating film (SOG film) preferably comprises one or more of silicon-containing compound selected from the group consisting of a polysilazane having a repeating unit represented by the following general formula (III), and an organic solvent:

(III)

wherein $R^1$, $R^2$ and $R^3$ each independently represent a hydrogen atom or an alkyl group having 1 to 8 carbon atoms.

The coating liquid for forming the insulating film (SOG film) preferably comprises one or more of silicon-containing compound selected from the group consisting of an alkoxysilane represented by the following general formula (I) or its hydrolyzate and a halogenated silane represented by the following general formula (II) or its hydrolyzate, one or more of silicon-containing compound selected from the group consisting of a polysilazane having a repeating unit represented by the following general formula (III), and an organic solvent:

$$X_nSi(OR)_{4-n} \qquad (I)$$

$$X_nSiX'_{4-n} \qquad (II)$$

wherein X represents a hydrogen atom, a fluorine atom, an alkyl group having 1 to 8 carbon atoms, a fluorine-substituted alkyl group, an aryl group or a vinyl group, R represents a hydrogen atom, an alkyl group having 1 to 8 carbon atoms, an aryl group or a vinyl group, X' represents a halogen atom, and n represents an integer of 0 to 3, provided that when silicon compounds represented by the above general formulae (I) and (II) are used together, at least one of X in the above general formulae (I) and (II) represents H (hydrogen atom);

(III)

wherein $R^1$, $R^2$ and $R^3$ each independently represent a hydrogen atom or an alkyl group having 1 to 8 carbon atoms.

Alkoxysilanes:

Specific examples of the alkoxysilane represented by the general formula (I) include methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane, and trifluoromethyltriethoxysilane.

Halogenated Silanes:

Specific examples of the halogenated silane represented by the general formula (II) include trichlorosilane, tribromosilane, dichlorosilane, fluorotrichlorosilane, fluorobromosilane, methyltrichlorosilane, ethyltrichlorosilane, phenyltrichlorosilane, and vinyltrichlorosilane.

In the case of using a hydrolyzate of alkoxysilane and/or halogenated silane, water is added in an amount necessary for the hydrolysis reaction to an organic solvent solution of the alkoxysilane and/or the halogenated silane, specifically in an amount of generally 0.1 to 5 mols, preferably 0.1 to 2 mols, per mol of the group Si-OR constituting the alkoxysilane or the group Si-X' constituting the halogenated silane and, if necessary, a catalyst is added in an amount of generally 0.001 to 1 mol per mol of the alkoxysilane or the halogenated silane.

Catalysts to be used here include inorganic acids such as hydrochloric acid, nitric acid and sulfuric acid; organic acids such as acetic acid, oxalic acid and toluenesulfonic acid; and compounds showing acidity in an aqueous solution such as metallic soaps.

As to reaction conditions of the hydrolysis, hydrolysis of the alkoxysilane is conducted generally at a reaction temperature of 80° C. or lower, preferably 5 to 60° C., for a reaction period of 10 hours or shorter, preferably 0.5 to 5 hours, under stirring. Also, hydrolysis of the halogenated silane is conducted generally at a reaction temperature of 50° C. or lower, preferably 5 to 20° C., for a reaction period of 20 hours or shorter, preferably 1 to 10 hours, under stirring. Further, in the case of hydrolyzing both the alkoxysilane and the halogenated silane at the same time, the hydrolysis conditions for the halogenated silane are generally employed.

The thus-obtained hydrolyzate or partial hydrolyzate has a number average molecular weight (in terms of polystyrene) that is desirably in the range of from 500 to 10,000, preferably from 1,000 to 5,000. When the number average molecular weight of the hydrolyzate or the partial hydrolyzate is within the above-described range, the result is a coating liquid showing an excellent stability with time and good coating properties.

Polysilazanes:

Polysilazanes having the repeating unit represented by the foregoing general formula (III) may be straight-chain polysilazanes, cyclic polysilazanes, or mixtures thereof. Such polysilazanes have a number average molecular weight (in terms of polystyrene) of from 500 to 10,000, preferably from 1,000 to 4,000. In the case where the number average molecular weight is less than 500, this might cause deteriorated filming properties, such as a too large shrinkage rate upon curing by heat. On the other hand, in the case where the number average molecular weight exceeds 10,000, this might cause deteriorated filming properties due to reduction in fluidity of the coating liquid. Also, in the case where the number average molecular weight of the polysilazane is outside the above-described range, this tends to result in an insulating film having no smooth surface.

Organic Solvents:

As the organic solvent to be used in the case of using the alkoxysilane and the halogenated silane, there are illustrated alcohols, ketones, ethers, esters and hydrocarbons. More specifically, there are illustrated alcohols such as methanol, ethanol, propanol and butanol; aliphatic ketones such as methyl ethyl ketone and methyl isobutyl ketone; cyclic ketones such as cyclohexanone; glycol ethers such as methyl cellosolve, ethyl cellosolve and propylene glycol monopropyl ether; glycols such as ethylene glycol, propylene glycol and hexylene glycol; esters such as methyl acetate, ethyl acetate, methyl lactate and ethyl lactate; hydrocarbons such as hexane, cyclohexane and octane; and aromatic hydrocarbons such as toluene, xylene and mesitylene.

Also, examples of the organic solvents to be used in the case of using the polysilazane include hydrocarbons such as cyclohexane, toluene, xylene and hexylene; halogenated hydrocarbons such as methylene chloride, ethylene chloride and trichloroethane; and others such as ethyl butyl ether, dibutyl ether, dioxane and tetrahydrofuran.

Easily Decomposable Resins:

Also, the insulating film-forming coating liquid to be used in the present invention may further contain an easily decomposable resin.

The easily decomposable resin to be used in the present invention has a number average molecular weight of from 500 to 50,000 (in terms of polystyrene) and is decomposed or vaporized by heat-treating at a temperature of 500° C. or lower or by irradiating with UV rays, IR rays, electron beams, X-rays or oxygen plasma.

Specific examples of the easily decomposable resin include cellulose-based resins, polyamide-based resins, polyester-based resins, acrylic resins, polyether-based resins, polyolefinic resins, polyol-based resins and epoxy-based resins having a number average molecular weight (in terms of polystyrene) of from 500 to 50,000, preferably from 1,000 to 30,000.

Also, it is preferred that the easily decomposable resin forms an interpenetrated polymer composition wherein the easily decomposable resin molecules are interlinked with the hydrolyzate and/or the polysilazane or the polysiloxane at a molecular chain level. Such interpenetrated polymer composition has a number average molecular weight (in terms of polystyrene) of desirably from 500 to 50,000, preferably from 1,000 to 30,000.

A problem develops when the insulating film-forming coating liquid containing the easily decomposable resin is used, in that when the projected portion of the coating film formed at the periphery of the substrate by the spin coating method is removed in the aforesaid manner by the conventional method described in, for example, Japanese Patent Laid-Open No. 316186/1996, a bump is liable to be formed. However, the process of the present invention enables the formation of a silica-containing insulating film having a low dielectric constant without forming any bump, wherein the film has a low density and a high strength and only exhibits voids or pores having an average pore size of substantially 5 nm or less.

As to a process for preparation of the interpenetrated polymer composition, detailed descriptions are given in International Application PCT/JP99/04051 or International Application PCT/JP99/04050 filed by the applicant(s), and reference should be made to these.

Next, an organic compound represented by the following general formula (IV) may be used as an organic template material in the coating liquid to be used in the present invention.

$$[R^1R^2R^3R^4N]^+\text{---}X^- \tag{IV}$$

wherein $R^1$ represents a hydrocarbyl group having 1 to 20 carbon atoms, $R^2$, $R^3$ and $R^4$ may be the same or different and each represent a H atom or a hydrocarbyl group having 1 to 20 carbon atoms and may be the same as $R^1$, and X represents a halogen atom or a OH group.

By the use of such organic template material, pores of about the same size as the organic template material are formed in the silica-containing coating film after removal of the organic template material, thus a silica-containing coating film with a low dielectric constant and a high film strength is obtained.

Specific examples of the organic template material include tetraethylammonium hydroxide, tetraethylammonium bromide, tetraethylammonium chloride, tetrapropylammonium hydroxide, tetrapropylammonium bromide, tetrapropylammonium chloride, n-hexadecyltrimethylammonium hydroxide, n-hexadecyltrimethylammonium bromide, n-octadecyltrimethylammonium hydroxide and n-octadecyltrimethylammonium bromide.

Of these, organic template materials (organic bases) wherein X represents a OH group also function as a catalyst for condensation of the alkoxysilane and/or the halogenated silane or the hydrolyzate thereof in the coating liquid, and hence use thereof accelerates cross-linking and particularly, even when the alkoxysilane and/or the halogenated silane or the hydrolyzate thereof has an SiH group at a terminal of the chains, they are effectively converted to a dense polysiloxane structure (having the following structure; 4-functional Q unit) wherein Q4 structure is effectively predominant, thus a silica-containing coating film with a high film strength being obtained.

The amount of the organic template material to be used is preferably within the range of from 10 to 200% by weight based on the weight of the solid components (silica-containing component being converted to $SiO_2$).

In the case where the amount of the organic template material used is less than 10% by weight, formation of pores of about the same size as that of the organic template materials becomes insufficient and, in some cases, a silica-containing coating film with a sufficiently low dielectric constant cannot be obtained.

In the case where the amount of the organic template material used exceeds 200% by weight, formation of the pores tends to be so excessive that it may cause a reduction in strength of the resultant silica-containing coating film.

The insulating film-forming coating liquid may further contain polysiloxane which is a reaction product between a silicon compound selected from the alkoxysilane represented by the foregoing general formula (I) and the halogenated silane represented by the foregoing general formula (II) or the hydrolyzate thereof and silica-containing fine particles, or polysiloxazane which is a reaction product between the polysilazane having a repeating unit represented by the foregoing general formula (III) and silica-containing fine particles.

The silica-containing fine particles can be obtained by mixing one or more of the alkoxysilanes represented by the general formula (I) with an organic solvent, and conducting hydrolysis and polycondensation in the presence of water and ammonia.

Also, the polysiloxane can be obtained by mixing the silica-containing fine particles and one or more of the silicon compounds selected from among the group consisting of the alkoxysilanes represented by the general formula (I) and the halogenated silanes represented by the general formula (II) with an organic solvent, and conducting hydrolysis in the presence of water and a catalyst.

Also, the polysiloxazane can be obtained by mixing the polysilazane having the repeating unit represented by the general formula (III) and the silica-containing fine particles with an organic solvent, and conducting hydrolysis in the presence of water and a catalyst.

These polysiloxane and polysiloxazane can be prepared according to the process described in Japanese Patent Laid-Open No. 315812/1997 (corresponding to U.S. Pat. No. 6,261,357) or International Application PCT/JP99/04050 filed by the applicant(s) of the present invention.

The coating liquid to be used in the present invention contains the hydrolyzate of the alkoxysilanes or the halogenated silanes, the polysiloxane, polysilazane, polysiloxazane, etc. in a range of 5 to 35% by weight, preferably 10 to 30% by weight, as solid components in an organic solvent.

In the case where the content of the solid components in the coating liquid is less than 5% by weight, a too thin coating film having insufficient insulating properties might result, whereas, in the case where the content of the solid components exceeds 35% by weight, stability of the coating liquid might be reduced and the resultant insulating film might have insufficient strength.

Additionally, in the present invention, the thus-obtained coating liquid containing the solid components may be used as a coating liquid for forming an insulating film, but it is preferred to separate the organic solvent component and replace it by methyl isobutyl ketone or propylene glycol monopropyl ether by a rotary evaporator to thereby remove an alcohol produced by the hydrolysis reaction and remaining water and the acid catalyst, and adjust the content of the solid components to the above-described range before use.

According to the present invention, semiconductor substrates having no protuberances or bumps of the coating film formed at the periphery of the substrates are provided, which serves to avoid development of cracks in the insulating film and formation or accumulation of foreign matter, and which exhibit excellent chemical resistance with a high production yield.

The present invention will now be illustrated with reference to the following Examples, which in no way limit the scope of the present invention.

EXAMPLE 1
Preparation of a Coating Liquid (S-1):

A mixed solution of 66.67 g of triethoxysilane (made by Shin-etsu Kagaku Kogyo K. K.) and 183.33 g of ethanol was kept at 20° C., and 21.82 g of an aqueous nitric acid solution having a concentration of 0.05% by weight was added thereto at a time, followed by conducting hydrolysis of triethoxysilane at a temperature of 20° C. for about 1 hour under stirring at a rate of 150 rpm. Subsequently, 10-fold amount of methyl isobutyl ketone (MIBK) was added thereto, and the solvent was replaced by methyl isobutyl ketone using a rotary evaporator to thereby completely remove alcohol generated by the hydrolysis reaction and dissolved water (including nitric acid) and obtain a triethoxysilane hydrolyzate (a matrix precursor dispersed) contained in the MIBK solution at a concentration of 20% by weight in terms Of $SiO_2$.

125 g of the thus-obtained solution in MIBK was mixed with 25 g of an acrylic resin (as an easily decomposable resin) dissolved in 100 g of the MIBK solution to obtain 250 g of a coating film-forming coating liquid (S-1). The acrylic resin has a number-average molecular weight of 22190 in terms of polystyrene.

Preparation of a Silica-Containing Film-Coated Semiconductor Substrate (L-1):

The thus-prepared coating liquid (S-1) was coated on a 8-inch silicon wafer (semiconductor substrate) according to the spin coating method.

Removal of a Projected Portion of the Coating Film:

Subsequently, propylene glycol monomethyl ether acetate (PGMEA) was used as a solvent for removing a projected portion of the coating film formed at the periphery of the substrate, and ejection of the solvent was initiated from the position (b) (FIG. 3) being 2 mm away from the periphery edge, followed by moving the ejecting nozzle to the periphery edge (a) (FIG. 3) to thereby remove the projected portion of the coating film. Subsequently, the substrate was subjected to a heat-treating step wherein the substrate was dried at a temperature of 150° C. for 3 minutes under an aerial atmosphere. In this heat treatment, the organic solvent contained in the coating film was evaporated and was discharged out of the system.

Subsequently, the substrate was mounted on a hot plate in a leaf-type curing unit having an upper lid (ACT-8; made by Tokyo Electron K. K.), and curing treatment was conducted under an inert gas at 400° C. for 30 minutes to produce a silica-containing film-coated semiconductor substrate (L-1). Subsequently, it was cooled to a temperature near room temperature, and was taken out of the unit.

The average film thickness (T) of the thus-obtained coating film was 500 nm. Also, the thickness of the coating film at the periphery ($T_E$) was 525 nm, with $T_E/T$ being 1.05.

EXAMPLE 2
Preparation of a Coating Liquid (S-2):

500 g of a mixed solution of 20.0 g of triethoxysilane (made by Shin-etsu Kagaku Kogyo K. K.) and 39.77 g of methyltrimethoxysilane (made by Shin-etsu Kagaku Kogyo K. K.) in ethanol was kept at 20° C., and 45 g of an aqueous nitric acid solution having a concentration of 0.05% by weight was added thereto at a time, followed by conducting hydrolysis of triethoxysilane and methyltrimethoxysilane at a temperature of 20° C. for about 1 hour under stirring at a rate of 150 rpm. Subsequently, 10-fold amount of MIBK was added thereto, and the solvent was replaced by MIBK using a rotary evaporator to thereby completely remove alcohol generated by the hydrolysis reaction and dissolved water (including nitric acid) and obtain a hydrolyzate of triethoxysilane and methyltrimethoxysilane (a matrix precursor dispersed) contained in the MIBK solution at a concentration of 20% by weight in terms of $SiO_2$.

125 g of the thus-obtained solution in MIBK was mixed with 3.75 g of an acrylic resin (as an easily decomposable resin) dissolved in 15 g of the MIBK solution to obtain 143.75 g of a coating film-forming coating liquid (S-2). The acrylic resin has a number-average molecular weight of 22190 in terms of polystyrene.

Preparation of a Silica-Containing Film-Coated Semiconductor Substrate (L-2):

The thus-prepared coating liquid (S-2) was coated on a 8-inch silicon wafer (semiconductor substrate) according to the spin coating method.

Removal of a Projected Portion of the Coating Film:

Subsequently, the projected portion of the coating film at the periphery was removed in the same manner as in Example 1, followed by the curing treatment to produce a silica-containing film-coated semiconductor substrate (L-2).

The average film thickness (T) and the thickness of the coating film at the periphery ($T_E$), and $T_E/T$ were determined and shown in Table 1.

Also, dielectric constant of the resultant silica-containing coating film was measured, and the periphery was visually checked for cracks. Results are shown in Table 1.

EXAMPLE 3
Preparation of a Coating Liquid (S-3):
Preparation of the Fine Particles of Silica:

To a solution consisting of a mixture of 139.1 g of pure water and 169.9 g of methanol which was being kept at 60° C., 2982.5 g of a water/methanol solution of tetraethoxysilane (Ethyl Silicate 28 produced by Tama Chemicals Co., Ltd.)(a solution prepared by adding 532.5 g of tetraethoxysilane to 2450 g of a water/methanol mixed solution of 2/8 in mixing ratio) and 596.4 g of an aqueous ammonia in an amount of 0.25% by weight were simultaneously added over a period of 52 hours. After completion of the addition, the mixture was aged at the same temperature for 3 hours. Thereafter, unreacted tetraethoxysilane, methanol and ammonia were removed by ultrafiltration, and simultaneously pure water was added, to thereby effect its purification. The silica concentration was adjusted to 5% by weight. A polycondensation reaction was carried out in an autoclave at 300° C. for 10 hours. After the reaction, the mixture was purified with the use of amphoteric ion exchange resin (AG-501 produced by R10-Rad). Thus, a dispersion of fine particles of silica having an average particle size of 30 nm was obtained.

The concentration of the dispersion of the fine particles of silica was adjusted to 5% by weight, and a 10-fold amount of methyl isobutyl ketone (MIBK) was added to the dispersion. Subsequently solvent replacement was carried out by means of a rotary evaporator so as to prepare 280 g of a MIBK dispersion having a silica concentration of 5% by weight and containing 0.5% by weight of water. Thereafter, 5.6 g of a MIBK dispersion of the fine particles of silica and 36.59 g of triethoxysilane were mixed with a MIBK solution prepared by dissolving 6 g of an acrylic acid (as an easily decomposable resin) in 51.81 g of MIBK to obtain 100 g of a mixture solution so that the weight ratio of X/Y (wherein X represents the weight of the fine particles of silica in terms of $SiO_2$, and Y represents the weight of the alkoxysilane in terms of $SiO_2$) became 2/98, and that the weight ratio of the sum weight of (X+Y) to the weight of the acrylic resin (Z), i.e., (X+Y)/(Z), became 70/30. This acrylic resin has a number-average molecular weight of 22190.

Subsequently, 100 g of an aqueous nitric acid solution having a concentration of 0.01% by weight was added at a time to the mixture solution, followed by conducting hydrolysis of triethoxysilane at a temperature of 20° C. for about 1 hour under stirring at a rate of 500 rpm. Thereafter, the MIBK layer was separated, and a solvent replacement to MIBK was carried out by means of a rotary evaporator to thereby completely remove alcohol generated by the hydrolysis reaction and dissolved water (including nitric acid) and obtain 100 g of a coating film-forming coating liquid (S-3) of 20% by weight in silica concentration.

Preparation of a Silica-Containing Film-Coated Semiconductor Substrate (L-3):

The thus-prepared coating liquid (S-3) was coated on a 8-inch silicon wafer (semiconductor substrate) according to the spin coating method.

Removal of a Projected Portion of the Coating Film:

Subsequently, the projected portion of the coating film at the periphery was removed in the same manner as in Example 1, followed by the curing treatment to produce a silica-containing film-coated semiconductor substrate (L-3).

The average film thickness (T) and the thickness of the coating film at the periphery ($T_E$), and $T_E/T$ were determined and shown in Table 1.

Also, dielectric constant of the resultant silica-containing coating film was measured, and the periphery was visually checked for cracks. Results are shown in Table 1.

EXAMPLE 4

Preparation of a Coating Liquid (S-4):

A mixed solution of 80.0 g of triethoxysilane (made by Shin-etsu Kagaku Kogyo K. K.), 68.18 g of methyltrimethoxysilane (made by Shin-etsu Kagaku Kogyo K. K.) and 451.82 g of ethanol was kept at 20° C., and 54.0 g of an aqueous nitric acid solution having a concentration of 0.05% by weight was added thereto at a time, followed by conducting hydrolysis of triethoxysilane and methyltrimethoxysilane at a temperature of 20° C. for about 1 hour under stirring at a rate of 150 rpm. Subsequently, 10-fold amount of propyl propylene glycol (PPG) was added thereto, and the solvent was replaced by propyl propylene glycol (PPG) using a rotary evaporator to thereby completely remove alcohol generated by the hydrolysis reaction and dissolved water (including nitric acid) and obtain a hydrolyzate of triethoxysilane and methyltrimethoxysilane (a matrix precursor dispersed) contained in the PPG solution at a concentration of 20% by weight in terms of $SiO_2$.

100 g of the thus-obtained solution in PPG was mixed with 25 g of a solution of n-hexadecyltrimethylammonium hydroxide (n-HDTMAH) (as an organic template material) in methanol at a concentration of 20% by weight to obtain 125 g of a coating film-forming coating liquid (S-4).

Preparation of a Silica-Containing Film-Coated Semiconductor Substrate (L-4):

The thus-prepared coating liquid (S-4) was coated on a 8-inch silicon wafer (semiconductor substrate) according to the spin coating method.

Removal of a Projected Portion of the Coating Film:

Subsequently, the projected portion of the coating film at the periphery was removed in the same manner as in Example 1, followed by the curing treatment to produce a silica-containing film-coated semiconductor substrate (L-4).

The average film thickness (T) and the thickness of the coating film at the periphery ($T_E$), and $T_E/T$ were determined and shown in Table 1.

Also, dielectric constant of the resultant silica-containing coating film was measured, and the periphery was visually checked for cracks. Results are shown in Table 1.

EXAMPLE 5

Preparation of a Coating Liquid (S-5):

600 ml of pyridine was charged in a reactor placed in a thermostatic chamber kept at 0° C., and 28.3 g of dichlorosilane was added thereto under stirring to form a complex (pyridine adduct).

Subsequently, ammonia was blown into the liquid containing the pyridine adduct to obtain a liquid containing a reaction product. The precipitate contained in this liquid was filtered off, and the filtrate was heated at 80° C. for 10 hours, followed by removing pyridine from the filtrate under reduced pressure to obtain a resinous polysilazane. Subsequently, this polysilazane was dissolved in xylene to prepare a solution of polysilazane in xylene at a concentration of 10% by weight. The resultant solution was mixed with methanol so that the molar ratio of polysilazane to methanol became 1/1. Thereafter, the solvent was replaced by pyridine, and reaction was conducted at a temperature of 90° C. for 20 hours under a nitrogen atmosphere while blowing dry nitrogen thereinto. Subsequently, the solvent was removed under reduced pressure to obtain a modified polysilazane.

This modified polysilazane was dissolved in xylene to prepare a coating film-forming coating liquid (S-5) containing the solid components at a concentration of 20% by weight.

Preparation of a Silica-Containing Film-Coated Semiconductor Substrate (L-5):

The thus-prepared coating liquid (S-5) was coated on a 8-inch silicon wafer (semiconductor substrate) according to the spin coating method.

Removal of a Projected Portion of the Coating Film:

Subsequently, the projected portion of the coating film at the periphery was removed in the same manner as in Example 1, followed by the curing treatment to produce a silica-containing film-coated semiconductor substrate (L-5).

The average film thickness (T) and the thickness of the coating film at the periphery ($T_E$), and $T_E/T$ were determined and shown in Table 1.

Also, dielectric constant of the resultant silica-containing coating film were measured, and the periphery was visually checked for cracks. Results are shown in Table 1.

EXAMPLE 6

Preparation of a Coating Liquid (S-6):

125 g of a coating film-forming coating liquid (S-6) was obtained in the same manner as in Example 5 except for dissolving the modified polysilazane in mesitylene.

Preparation of a Silica-Containing Film-Coated Semiconductor Substrate (L-6):

The thus-prepared coating liquid (S-6) was coated on a 8-inch silicon wafer (semiconductor substrate) according to the spin coating method.

Removal of a Projected Portion of the Coating Film:

Subsequently, the projected portion of the coating film was removed in the same manner as in Example 1, followed by the curing treatment to produce a silica-containing film-coated semiconductor substrate (L-6).

The average film thickness (T) and the thickness of the coating film at the periphery ($T_E$), and $T_E/T$ were determined and shown in Table 1.

Also, dielectric constant of the resultant silica-containing coating film were measured, and the periphery was visually checked for cracks. Results are shown in Table 1.

COMPARATIVE EXAMPLE 1

Preparation of a Silica-Containing Film-Coated Semiconductor Substrate (L-7):

The coating liquid (S-2) used in Example 2 was coated on a 8-inch silicon wafer (semiconductor substrate) according to the spin coating method.

Subsequently, heat treatment (i.e., drying and curing) was conducted in the same manner as in Example 2 without removing the projected portion of the coating film at the periphery to produce a silica-containing film-coated semiconductor substrate (L-7).

The average film thickness (T) and the thickness of the coating film at the periphery ($T_E$), and $T_E/T$ were determined and shown in Table 1.

Also, dielectric constant of the resultant silica-containing coating film were measured, and the periphery was visually checked for cracks. Results are shown in Table 1.

COMPARATIVE EXAMPLE 2

Preparation of a Silica-Containing Film-Coated Semiconductor Substrate (L-8):

The coating liquid (S-2) used in Example 2 was coated on a 8-inch silicon wafer (semiconductor substrate) according to the spin coating method.

Removal of a Projected Portion of the Coating Film:

Subsequently, PGMEA was used as a solvent for removing the projected portion of the coating film at the periphery, and the nozzle was moved from the position (a) (FIG. 3) to the position (b) (FIG. 3) being 2 mm away from the periphery edge, then from the position (b) to the position (a) while ejecting the solvent through the nozzle to thereby remove the projected portion of the coating film.

Subsequently, heat treatment (i.e., drying and curing) was conducted in the same manner as in Example 2 to produce a silica-containing film-coated semiconductor substrate (L-8).

The average film thickness (T) and the thickness of the coating film at the periphery ($T_E$) (including the formed bump), and $T_E/T$ were determined and shown in Table 1.

Also, dielectric constant of the resultant silica-containing coating film were measured, and the periphery was visually checked for cracks. Results are shown in Table 1.

COMPARATIVE EXAMPLE 3

Preparation of a Silica-Containing Film-Coated Semiconductor Substrate (L-9):

The coating liquid (S-4) used in Example 4 was coated on a 8-inch silicon wafer (semiconductor substrate) according to the spin coating method.

Removal of a Projected Portion of the Coating Film:

Subsequently, cyclohexane was used as a solvent for removing the projected portion of the coating film at the periphery, and the nozzle was moved from the position (a) (FIG. 3) to the position (b) (FIG. 3) being 2 mm away from the periphery edge, then from the position (b) to the position (a) while ejecting the solvent through the nozzle to thereby remove the projected portion of the coating film.

Subsequently, heat treatment (i.e., drying and curing) was conducted in the same manner as in Example 4 to produce a silica-containing film-coated semiconductor substrate (L-9).

The average film thickness (T) and the thickness of the coating film at the periphery ($T_E$) (including the formed bump), and $T_E/T$ were determined and shown in Table 1.

Also, dielectric constant of the resultant silica-containing coating film were measured, and the periphery was visually checked for cracks. Results are shown in Table 1.

TABLE 1

| | Insulating film-forming coating liquid | | EBR | | Semiconductor Substrate | | | |
|---|---|---|---|---|---|---|---|---|
| | | | | | Insulating Film | | Development of Cracks | |
| | Coating liquid No. | Solvent | Solvent for Removal | Dragging Distance mm Direction | Average Film Thickness (T) nm | $T_E/T$ | (Anti-cracking Properties) | Dielectric Constant |
| Ex. 1 | 1 | MIBK | PGMEA | 2<br>b → a | 500 | 1.02 | no | 2.2 |
| Ex. 2 | 2 | MIBK | PGMEA | 2<br>b → a | 500 | 1.02 | no | 2.2 |
| Ex. 3 | 3 | MIBK | PGMEA | 2<br>b → a | 500 | 1.02 | no | 2.2 |
| Ex. 4 | 4 | PGP | cyclohexanone | 2<br>b → a | 500 | 1.03 | no | 2.0 |
| Ex. 5 | 5 | xylene | cyclohexanone | 2<br>b → a | 500 | 1.03 | no | 4.0 |
| Ex. 6 | 6 | mesitylene | cyclohexanone | 2<br>b → a | 500 | 1.03 | no | 4.0 |
| Comp. Ex. 1 | 2 | MIBK | PGMEA | not done | 500 | 1.25 | yes | 2.2 |
| Comp. Ex. 2 | 2 | MIBK | PGMEA | 2<br>a → b → a | 500 | 1.75 | yes | 2.2 |

TABLE 1-continued

| | Insulating film-forming coating liquid | | EBR | | Semiconductor Substrate | | | |
|---|---|---|---|---|---|---|---|---|
| | | | | | Insulating Film | | Development of Cracks | |
| | Coating liquid No. | Solvent | Solvent for Removal | Dragging Distance mm Direction | Average Film Thickness (T) nm | $T_E/T$ | (Anti-cracking Properties) | Dielectric Constant |
| Comp. Ex. 3 | 4 | PGP | cyclohexanone | 2<br>a → b → a | 500 | 1.80 | yes | 2.0 |

In Comparative Example 1, the projected portion remained.
In Comparative Examples 2 and 3, a bump was formed.

While the present invention has been described in detail and with reference to specific embodiments thereof, it will be apparent to one skilled in the art that various changes and modifications can be made therein without departing from the spirit and scope thereof.

What is claimed is:

1. A process for producing semiconductor substrates, which comprises the steps of:
   (a) forming a coating film by coating an insulating film-forming coating liquid on a substrate mounted on a rotating disc of a spin coater according to a spin coating method; and then
   (b) removing a projected portion of the coating film formed at a periphery of the substrate by ejecting a solvent through a nozzle moving from any point on a line drawn between a periphery edge and a center of the substrate toward the periphery edge while rotating the substrate.

2. The process for producing semiconductor substrates as claimed in claim 1, wherein the insulating film-forming coating liquid comprises one or more of silicon-containing compound selected from the group consisting of an alkoxysilane represented by the following general formula (I) or its hydrolyzate and a halogenated silane represented by the following general formula (II) or its hydrolyzate, and an organic solvent:

$$X_n Si(OR)_{4-n} \quad (I)$$

$$X_n SiX'_{4-n} \quad (II)$$

wherein X represents a hydrogen atom, a fluorine atom, an alkyl group having 1 to 8 carbon atoms, a fluorine-substituted alkyl group, an aryl group or a vinyl group, R represents a hydrogen atom, an alkyl group having 1 to 8 carbon atoms, an aryl group or a vinyl group, X' represents a halogen atom, and n represents an integer of 0 to 3, provided that when silicon compounds represented by the above general formulae (I) and (II) are used together, at least one of X in the above general formulae (I) and (II) represents H (hydrogen atom).

3. The process for producing semiconductor substrates as claimed in claim 2, wherein the insulating film-forming coating liquid further contains an easily decomposable resin.

4. The process for producing semiconductor substrates as claimed in claim 1, wherein the insulating film-forming coating liquid comprises one or more of silicon-containing compound selected front the group consisting of a polysilazane having a repeating unit represented by the following general formula (III), and an organic solvent:

(III)

wherein $R^1$, $R^2$ and $R^3$ each independently represent a hydrogen atom or an alkyl group having 1 to 8 carbon atoms.

5. The process for producing semiconductor substrates as claimed in claim 4, wherein the insulating film-forming coating liquid further contains an easily decomposable resin.

6. The process for producing semiconductor substrates as claimed in claim 1, wherein the insulating film-forming coating liquid comprises one or more of silicon-containing compound selected from the group consisting of an alkoxysilane represented by the following general formula (I) or its hydrolyzate and a halogenated silane represented by the following general formula (II) or its hydrolyzate, one or more of silicon-containing compound selected from the group consisting of a polysilazane having repeating unit represented by the following general formula (III), and an organic solvent:

$$X_n Si(OR)_{4-n} \quad (I)$$

$$X_n SiX'_{4-n} \quad (II)$$

wherein X represents a hydrogen atom, a fluorine atom, an alkyl group having 1 to 8 carbon atoms, a fluorine-substituted alkyl group, an aryl group or a vinyl group, R represents a hydrogen atom, an alkyl group having 1 to 8 carbon atoms, an aryl group or a vinyl group, X' represents a halogen atom, and n represents an integer of 0 to 3, provided that when silicon compounds represented by the above general formulae (I) and (II) are used together, at least one of X in the above general formulae (I) and (II) represents H (hydrogen atom);

(III)

wherein $R^1$, $R^2$ and $R^3$ each independently represent a hydrogen atom or an alkyl group having 1 to 8 carbon atoms.

7. The process for producing semiconductor substrates as claimed in claim 6, wherein the insulating film-forming coating liquid further contains an easily decomposable resin.

8. The process for producing semiconductor substrates as claimed in claim 1, wherein the spin coater is operated at 500 to 5000 rpm in rotation number, 20 to 30° C. in temperature, and 5 seconds to 5 minutes in time.

9. The process for producing semiconductor substrates as claimed in claim 1, wherein the projected portion of the coating film is removed by moving an ejecting nozzle from the position (b) being a vicinity of the boundary between the projected portion and the flat portion, in the direction of from the center to the periphery, to the position (a) being an edge of the periphery of the substrate while ejecting the solvent through the nozzle.

10. The process for producing semiconductor substrates as claimed in claim 1, wherein the solvent for removing the projected portion of the coating film is selected from the group consisting of alcohols, ketones, glycol, ethers, and propylene glycol monomethyl ether acetate.

* * * * *

UNITED STATES PATENT AND TRADEMARK OFFICE
CERTIFICATE OF CORRECTION

PATENT NO. : 6,716,773 B2
APPLICATION NO. : 10/246833
DATED : April 6, 2004
INVENTOR(S) : Egami et al.

It is certified that error appears in the above-identified patent and that said Letters Patent is hereby corrected as shown below:

Column 1, Lines 38-39, "as a highly" should read --as highly--

Column 19, Line 65, Claim 4, "selected front" should read --selected from--

Column 22, Line 7, Claim 10, "glycol, ethers" should read --glycol ethers--

Signed and Sealed this

Fourteenth Day of August, 2007

JON W. DUDAS
*Director of the United States Patent and Trademark Office*